(12) United States Patent
Olsen

(10) Patent No.: US 8,479,724 B1
(45) Date of Patent: Jul. 9, 2013

(54) PASSIVE COOLING SYSTEM FOR LIGHTWEIGHT SOLAR COLLECTOR ASSEMBLY AND ARRAY

(75) Inventor: Randall B. Olsen, Carlsbad, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 254 days.

(21) Appl. No.: 13/049,108

(22) Filed: Mar. 16, 2011

(51) Int. Cl.
*F24J 2/36* (2006.01)

(52) U.S. Cl.
USPC ............ 126/625; 126/626; 126/684; 126/696

(58) Field of Classification Search
USPC ................. 126/625, 626, 600, 605, 684, 689, 126/680, 696, 692, 693
See application file for complete search history.

(56) References Cited

U.S. PATENT DOCUMENTS

| | | |
|---|---|---|
| 3,125,091 A | 3/1964 | Sleeper |
| 4,051,834 A | 10/1977 | Fletcher |
| 4,131,336 A | 12/1978 | Frosch |
| 4,136,671 A | 1/1979 | Whiteford |
| 4,151,830 A | 5/1979 | Crombie |
| 4,184,482 A | 1/1980 | Cohen |
| 4,203,425 A | 5/1980 | Clark |
| 4,238,265 A | 12/1980 | Deminet |
| 4,239,344 A | 12/1980 | Wildenrotter |
| 4,271,822 A | 6/1981 | Radebold |
| 4,328,790 A | 5/1982 | Kircus |
| 4,432,342 A | 2/1984 | Lucas |
| 4,440,149 A | 4/1984 | Hattan |
| 4,458,673 A | 7/1984 | Benjamin |
| 4,547,432 A | 10/1985 | Pitts |
| 4,670,338 A | 6/1987 | Clemino |
| 5,056,892 A | 10/1991 | Cobb |
| 5,208,704 A | 5/1993 | Zito |
| 5,365,920 A | 11/1994 | Lechner |
| 5,956,191 A | 9/1999 | Blackmon |
| 6,176,588 B1 | 1/2001 | Davis |

(Continued)

OTHER PUBLICATIONS

Xiao, G., "A Closed Parabolic Trough Solar Collector", INRIA-a CCSD electronic archive server based on P.A.O.L. (France), Oct. 2007.

(Continued)

*Primary Examiner* — Alfred Basichas
(74) *Attorney, Agent, or Firm* — Kyle Eppele; Stephen E. Baldwin

(57) ABSTRACT

In one embodiment, a solar collector assembly includes a sealed and inflated cylindrical-tube shaped housing, the tube housing including a bottom cylindrically-trough shaped reflector portion having a reflection surface extending along a longitudinal length. The reflection surface is made of a relatively thin and flexible metalized polymer film. A top cylindrically-shaped transparent polymer film sheet portion is made of a relatively thin and flexible polymer film, the top and bottom sheet portions forming a pressure sealed cylindrical tube housing when the respective ends of the top and bottom films are sealed together and the tube housing is inflated with a gas so that the top transparent film portion passes solar energy to the reflection surface. A receiver tube is disposed longitudinally above the reflection surface in a focal line or focal plane of the cylindrical-trough shaped reflector portion, the absorber tube extending along the longitudinal length of the reflection surface, the absorber tube containing a first heat transfer fluid for absorbing solar energy reflected from the reflection surface to the focal line or focal plane. A passive cooling component including a partially hollowed wall structure extends below and longitudinally along the bottom cylindrical shaped housing wherein the hollowed wall structure includes multiple cooling loop convection cells formed within the hallowed wall structure.

19 Claims, 18 Drawing Sheets

U.S. PATENT DOCUMENTS

| | | |
|---|---|---|
| 6,206,531 B1 | 3/2001 | Williams |
| 6,994,082 B2 | 2/2006 | Hochberg |
| 7,077,532 B1 | 7/2006 | Diver |
| 7,343,913 B2 | 3/2008 | Niedermeyer |
| RE40,227 E | 4/2008 | Cobb |
| 7,395,820 B2 | 7/2008 | Kuckelkorn |
| 7,709,730 B2 | 5/2010 | Johnson |
| 2003/0150444 A1 | 8/2003 | Cedenblad |
| 2006/0144393 A1 | 7/2006 | Le Lievre |
| 2007/0186921 A1 | 8/2007 | Swanepoel |
| 2008/0047546 A1 | 2/2008 | Cummings |
| 2008/0047547 A1 | 2/2008 | Jona |
| 2008/0135095 A1 | 6/2008 | Cummings |
| 2008/0168981 A1 | 7/2008 | Cummings |
| 2009/0260620 A1 | 10/2009 | Winger |
| 2010/0043777 A1 | 2/2010 | Tabor |
| 2010/0043778 A1 | 2/2010 | Penciu |
| 2010/0051021 A1 | 3/2010 | Kunz |
| 2010/0101562 A1 | 4/2010 | Pellegrino |
| 2010/0108057 A1 | 5/2010 | Cummings |
| 2010/0186733 A1 | 7/2010 | Hoefler |
| 2010/0206296 A1 | 8/2010 | Matalon |
| 2010/0212657 A1 | 8/2010 | Moller |
| 2010/0212719 A1 | 8/2010 | Stolum |
| 2010/0224232 A1 | 9/2010 | Cummings |
| 2010/0229850 A1 | 9/2010 | Sankrithi |

OTHER PUBLICATIONS

Shanfelt, D. and Winn, R., "A Paradigm Shift in Solar Collectors", Energy Conversion Engineering Conference, pp. 1720-1723, Aug. 1996.

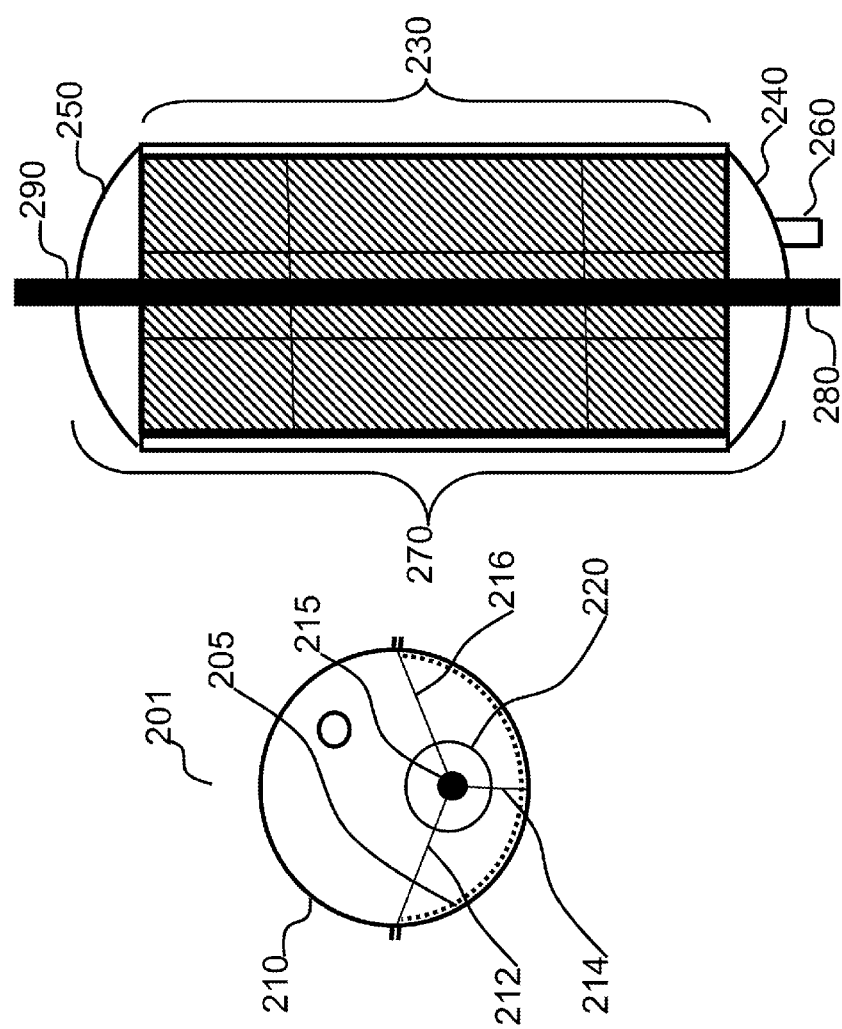

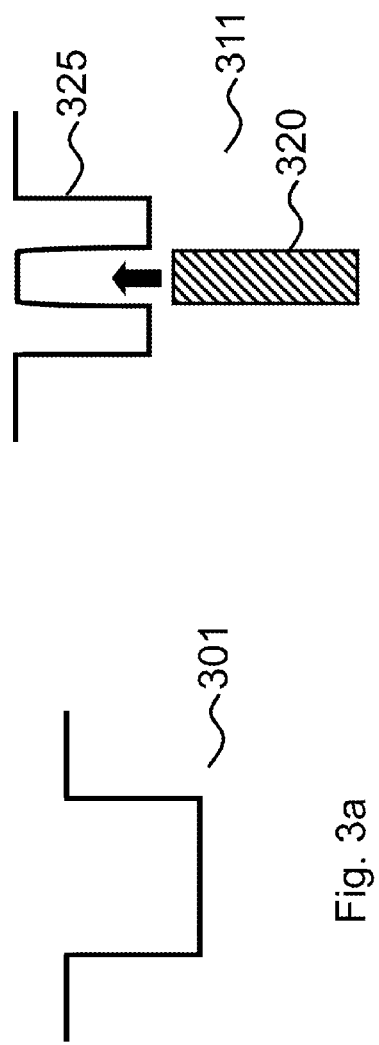
Fig. 3a
Fig. 3b
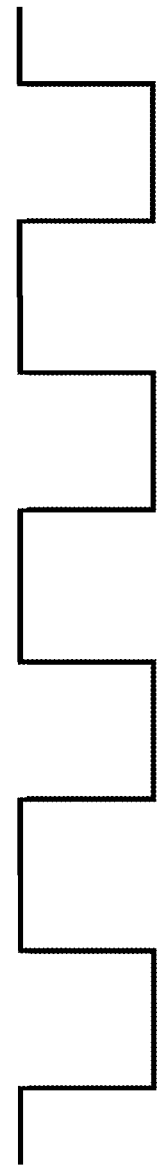
Fig. 4

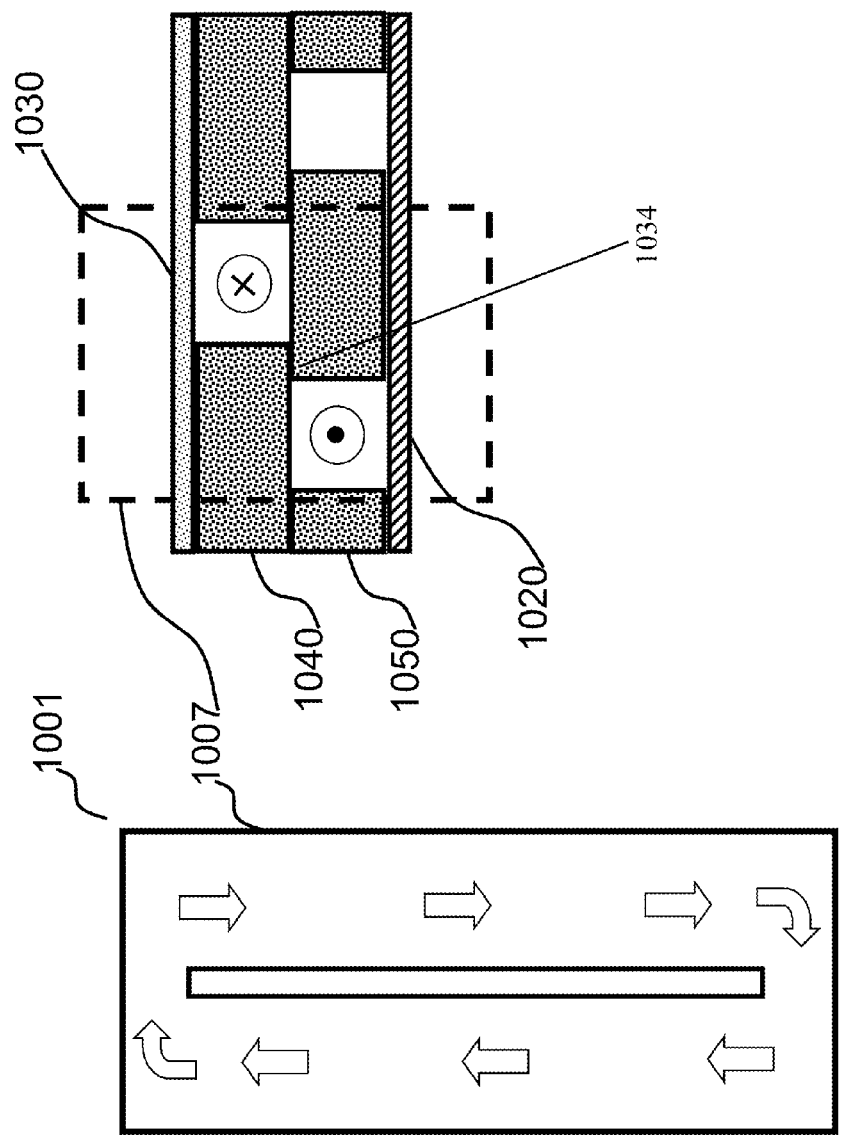

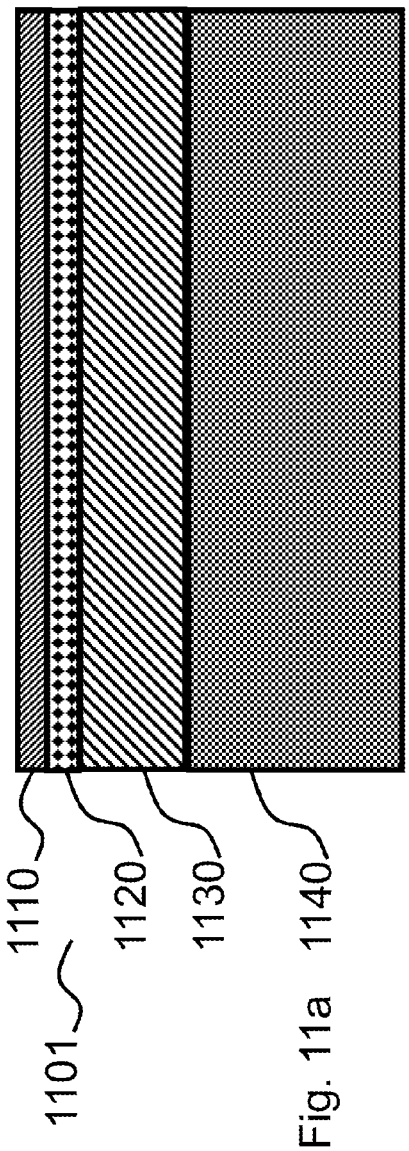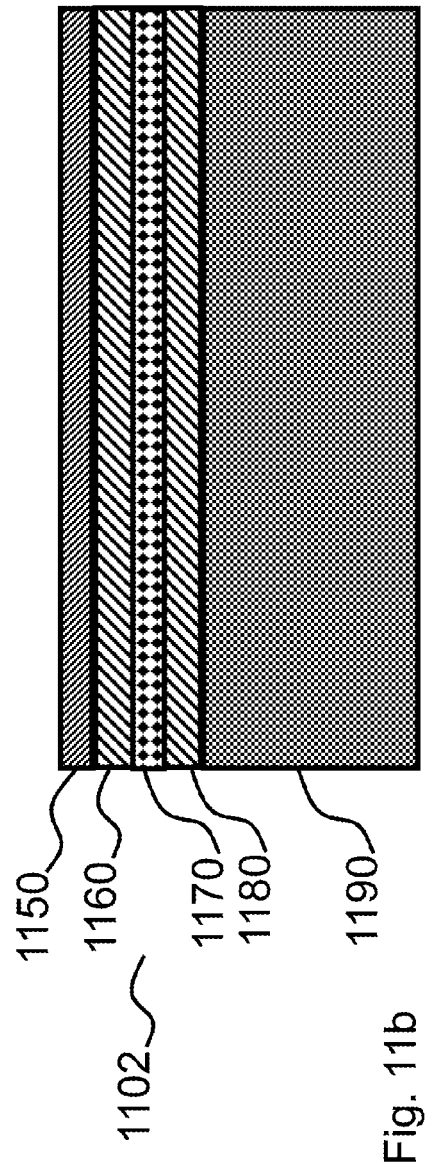

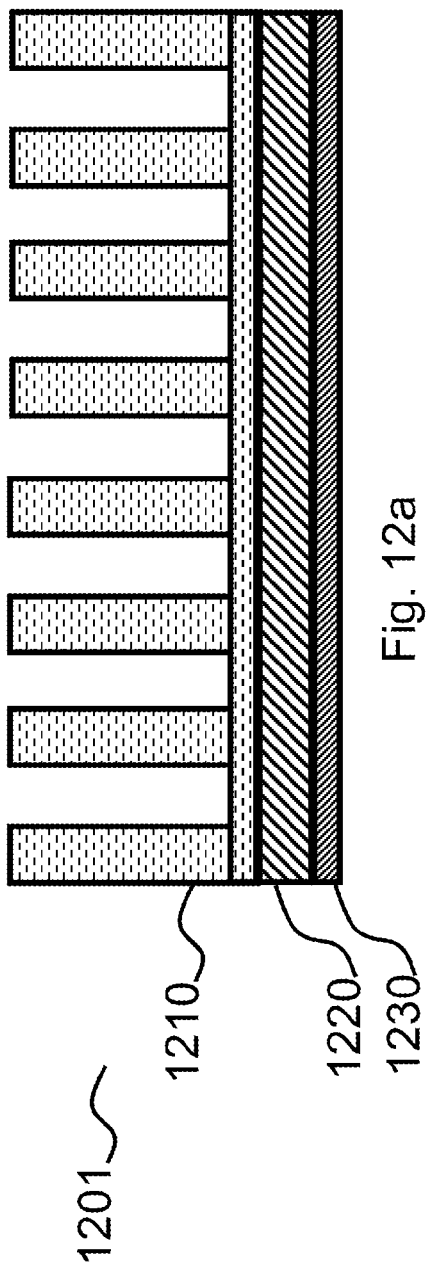
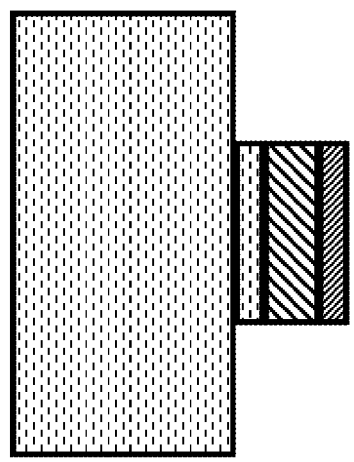
Fig. 12a
Fig. 12b
1201
1210
1220
1230

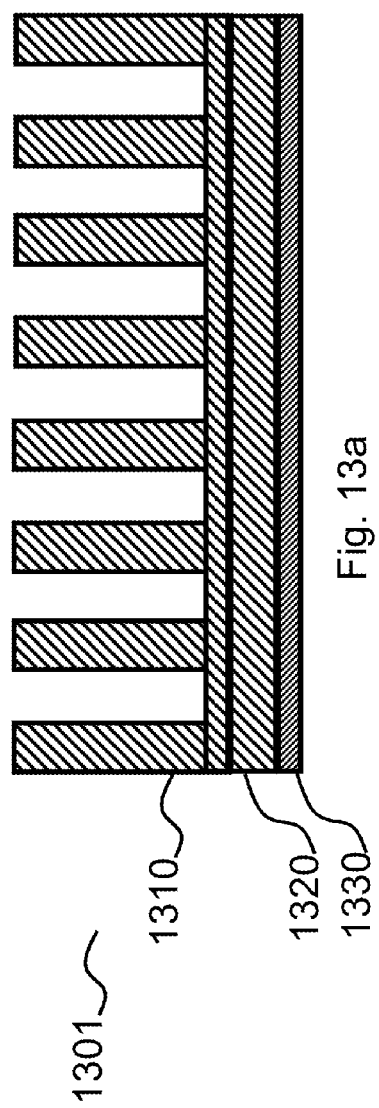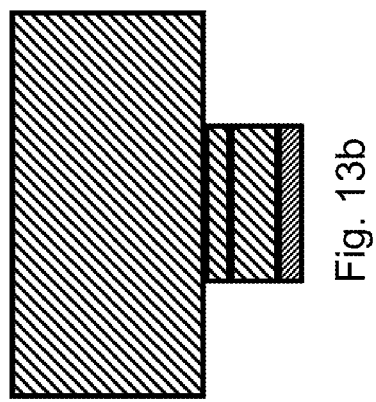
Fig. 13a
Fig. 13b

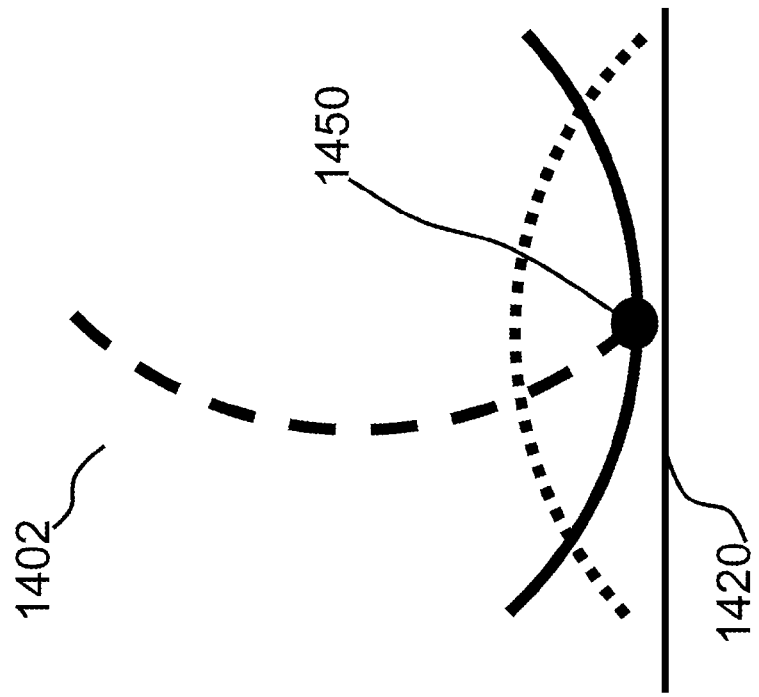
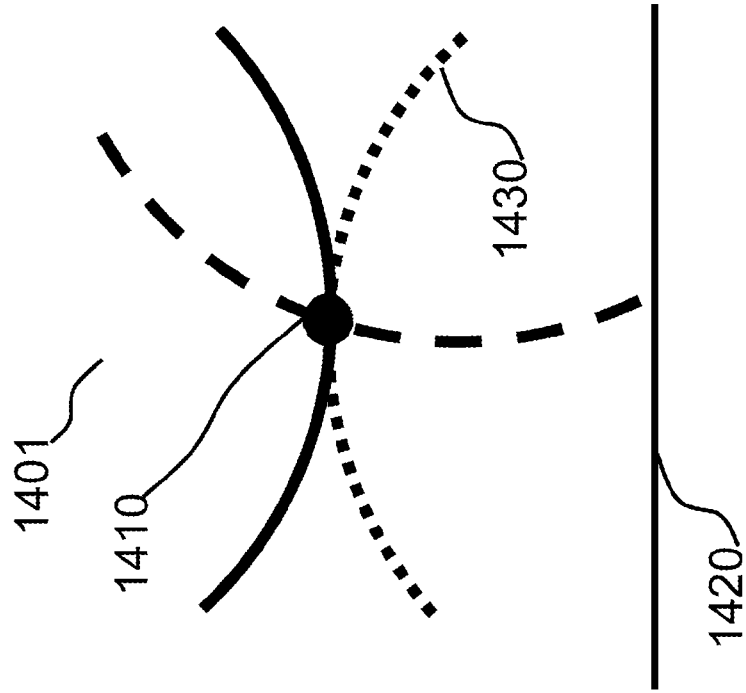
Fig. 14a
Fig. 14b

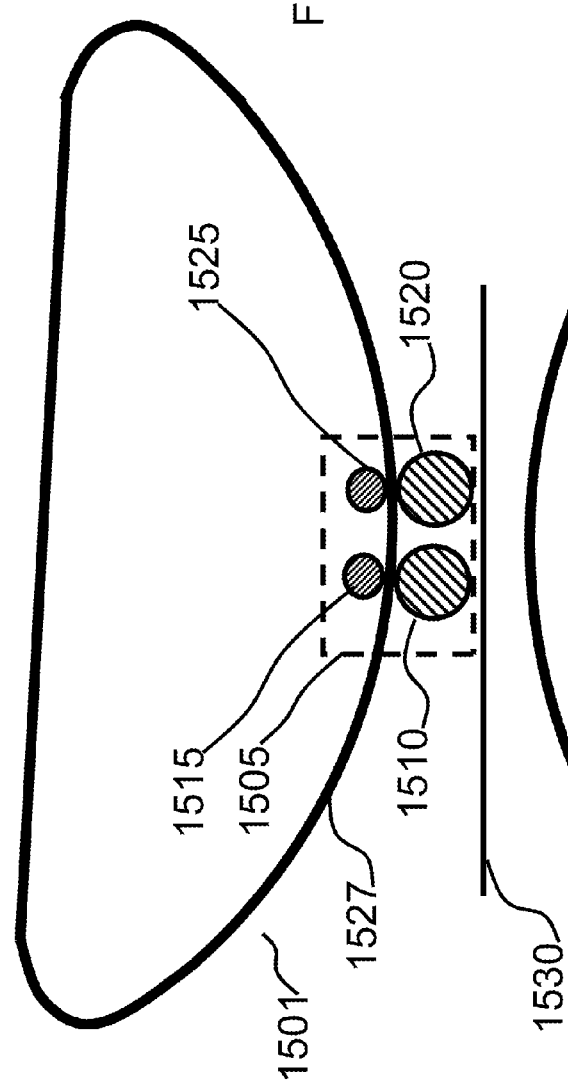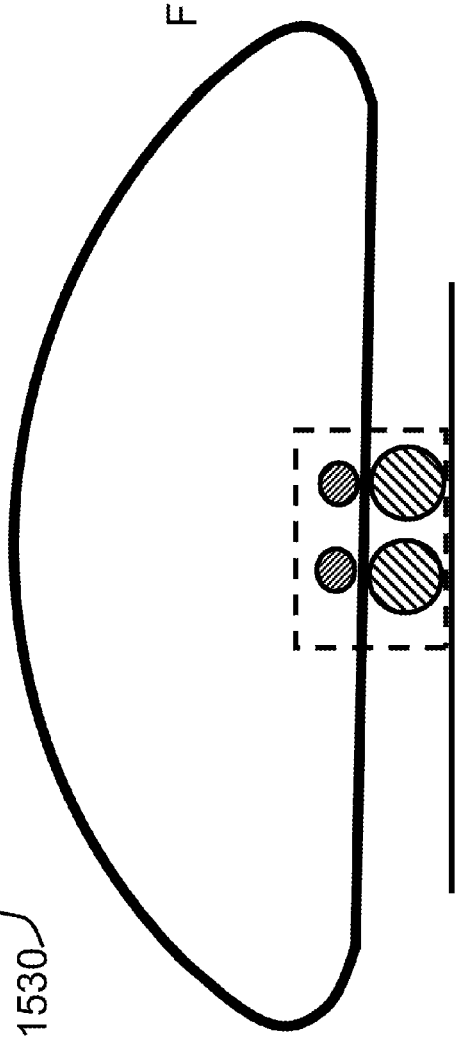

PASSIVE COOLING SYSTEM FOR LIGHTWEIGHT SOLAR COLLECTOR ASSEMBLY AND ARRAY

FEDERALLY-SPONSORED RESEARCH AND DEVELOPMENT

This invention (Navy Case NC 100,710) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_t2@navy.mil

CROSS-REFERENCE TO RELATED PATENT APPLICATIONS

This application is related to patent application Ser. No. 13/017,154, filed Jan. 31, 2011, entitled "Lightweight Solar Collector Assembly and Array", and Ser. No. 13/028,414, filed Feb. 16, 2011, entitled "Tracking System for Lightweight Solar Collector Assembly and Array", both of which are assigned to the same assignee as the present application and which are hereby incorporated by reference herein.

BACKGROUND OF THE INVENTION

This invention relates generally to apertures of radiant energy (e.g. electromagnetic radiation and sound) both for collecting and emitting. The aperture of the invention is particularly adaptable to the collection of solar energy for use in heating systems, thermal to electrical conversion systems and in photovoltaic conversions systems. The aperture is also particularly well suited to relatively low cost, labor saving methods for erecting and maintaining such solar energy systems.

Over the years a variety of systems have been devised for the collection and utilization of solar energy. While many of these systems are quite efficient in accomplishing the objective, i.e. collecting and storing solar energy to supplement or replace more expensive systems utilizing common sources of energy, one primary problem remains, the initial cost of making and installing an efficient solar energy collecting system. If a solar energy collecting system is very expensive to make and install, such high capital expenditure is undesirable, since the potential user must wait too long to amortize this cost before realizing any savings in energy expense.

It is well known that solar energy may be converted into other useful forms of energy by using proper techniques. For example, solar energy may be converted into electrical energy by a so-called solar cell. The most common solar cells are made of silicon, but cells made of other materials, e.g., cadmium sulfide and gallium arsenide, have also been developed and tested. The required voltage and/or amperage may be generated using an appropriate series-parallel matrix in an integrated array.

At the current state of the art, a principal obstacle to wide scale adoption of solar cell energy collector installations is that manufacturing and installation costs of solar cell arrays generally are substantially higher than the cost of conventional electrical energy generating installations. Another factor limiting wide spread adoption of solar panel cells is radiant heating of the cells which reduces cell efficiency.

While the cost of manufacturing the solar cells per se currently is the single largest cost factor in the manufacture of a solar cell energy collector installation, any technique which increases the overall efficiency of a solar cell energy collector, or which reduces the cost of manufacturing and/or installing a solar cell energy collection system may have significant commercial importance.

In addition to the photoelectric conversion technique just described, it is well known that solar energy may be converted to other more useful forms of energy through thermal conversion techniques. Typically thermal conversion techniques involve using sunlight to heat up a liquid or gas contained in a thermal converter enclosure and then utilizing the heated liquid or gas in an appropriate manner well known to one skilled in the art to generate power.

However, as in the case of solar cells, relatively low energy collection efficiency, relatively high cost of manufacturing and relatively high installation costs have presented a principal obstacle to wide scale adoption of solar thermal energy collectors. Thus, any technique which increases the overall efficiency of a solar thermal energy collector of which reduces the cost of manufacturing and/or installing a solar thermal energy collector system may have significant commercial importance.

One technique the art has developed to increase efficiency of solar cells and thermal converters is to collect and focus solar energy onto the solar cells or thermal converters by means of a so-called "solar concentrator". Thus a typical solar energy collection system may include reflective or refractive devices which are designed to collect solar energy impinging upon a relatively large area and to focus the collected energy onto a relatively small area of utilization. While the use of solar concentrators result in economic savings by increasing the effective collection area of a solar cell or thermal converter, the prior art solar concentrators themselves are costly to manufacture, and also may add appreciably to the weight of the solar energy collector system. This latter consideration is particularly important in the case of solar cell or solar thermal energy collector systems which are to be used on buildings since the heavier a solar energy collector system is, the more costly the required supporting structure.

SUMMARY OF THE INVENTION

Accordingly, a primary object of this invention is to provide a solar energy concentrator which substantially overcomes or avoids a number of the aforesaid problems encountered in the manufacture and use of solar energy collector systems according to prior art. Another object is to provide a method of making solar energy concentrators which are especially light weight, and which can be manufactured using relatively inexpensive, commercially available materials. Yet other objects of the invention are (1) to provide solar energy concentrators which may be effectively and easily employed for the collection and utilization of solar energy, (2) to provide solar energy concentrators of the type described in combination with solar cells for increasing the intensity of radiation received by such cells and also for distributing the concentration of such radiation, and (3) to provide relatively low cost, labor saving methods for erecting and maintaining solar energy collectors of the type described. Still other objects are to provide solar cell collection systems with means for cooling the solar cell, and to provide solar energy concentrators of the type described in combination with solar thermal converters.

An object of the present invention is to provide a method of making a solar reflector which is very economical because of the utilization of inexpensive materials.

Another object is to provide such a method wherein the steps for fabricating the few parts making up the assembly are simple and can be carried out inexpensively.

A further object of the invention is to provide such a method which involves very few steps to complete the assembly of the unit thereby reducing labor costs.

Another object of the invention is to provide such a method wherein the steps thereof can be carried out without utilization of expensive machinery, indeed one that can be accomplished with inexpensive standard tools.

Still another object is to provide an improved tracking system for a lightweight solar collector assembly and array.

A further object is to provide a passive cooling system for a lightweight solar collector assembly and array.

Other objects, advantages and salient features of the present invention will become apparent from the following detailed description, which, taken in conjunction with the accompanying drawings discloses a preferred embodiment thereof.

BRIEF DESCRIPTION OF THE DRAWINGS

The invention will be more fully described in connection with the annexed drawings, where like reference numerals designate like components, in which:

FIG. 1b is a top view of the solar energy collector of FIG. 1a;

FIG. 2a is an end view of another embodiment a solar energy collector utilizing the lightweight aperture of the invention;

FIG. 2b is a top view of the solar energy collector of FIG. 2a;

FIG. 3a is a cross-section view of a vacuum-formed support rib;

FIG. 3b is a cross-section view of a high modulus support rib;

FIG. 4 is a cross-section view of a vacuum-formed support structure;

FIG. 5b is a top view of the solar energy collector of FIG. 5a;

FIG. 6b is a top view of the solar energy collector of FIG. 6a;

FIG. 7a is an end view of another embodiment a solar energy collector utilizing the lightweight aperture of the invention;

FIG. 7b is a top view of the solar energy collector of FIG. 7a;

FIG. 8b is a top view of the solar energy collector of FIG. 8a;

FIG. 10a is a side view of a passive cooling loop of the invention;

FIG. 10b is a top view of the passive cooling loop of FIG. 10a;

FIG. 11a is a side view of field-replaceable module of the invention;

FIG. 11b is a side view of a second embodiment of a field-replaceable module;

FIG. 12a is a side view of a passive cooling plate of the invention;

FIG. 12b is an end view of the passive cooling plate of FIG. 12a;

FIG. 13a is a side view of a heat exchanger of the invention;

FIG. 13b is an end view of the heat exchanger of FIG. 13a;

FIG. 14a is a schematic end view of a rotation mechanism of the invention;

FIG. 14b is a schematic end view of a translation mechanism of the invention;

FIG. 15 is an end view of a translation mechanism capable of inverting a lightweight aperture

DETAILED DESCRIPTION OF THE PREFERRED EMBODIMENTS

Figure 1B:
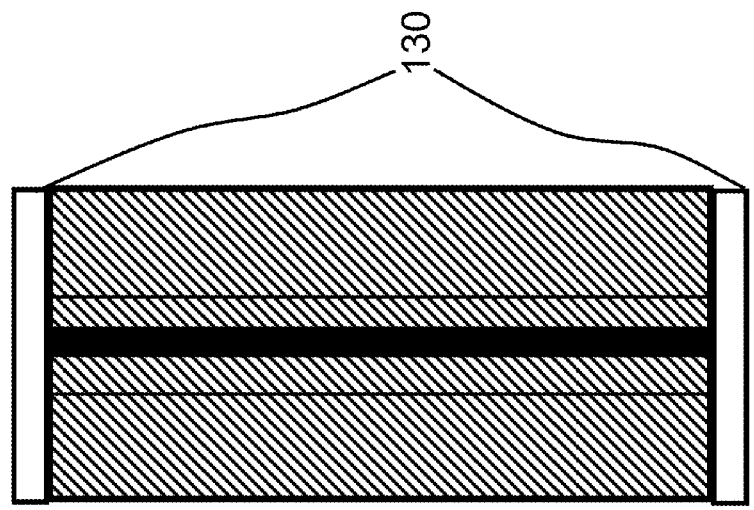
Figure 1A:
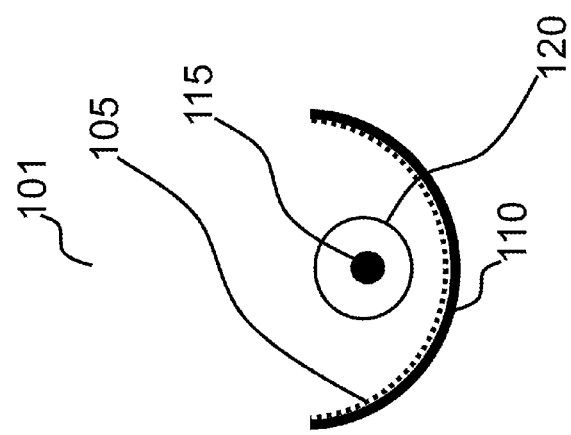
FIG. 1a is an end view of a solar energy collector utilizing the lightweight aperture of the invention.

FIG. 1a is an end view of a solar energy collector 101 utilizing the lightweight aperture of the invention. FIG. 1b is a top view of the solar energy collector 101 of FIG. 1a, and can be either a complete collector or section of a longer collector. Solar energy collector 101 is an example of a concentrator. Solar energy collector 101 comprises a reflector 105 with a concentrating shape, which in this case is approximately the shape of a parabolic trough. The parabolic trough shape is a specific example of an approximately constant cross-section shape. The parabolic trough shape is a specific example of a surface with substantial curvature in only one dimension. Reflector 105 is held in place and in shape by trough 110 which is an example of a first support means for the reflector 105. By itself, reflector 105 would not be able to maintain its shape against the force of gravity since it is very thin and hence very flexible. A preferred example of reflector 105 is a metallized (e.g. aluminum) polymer (e.g. polyester terephthalate (PET)) film with a thickness under 250 μm and more preferably with a thickness of about 50 μm. For added lifetime its is also preferred that reflector 105 also be protected by a thin topcoat of acrylic containing ultraviolet (UV) light blockers, stabilizers, or brighteners or the like as is well know in the art of sunlight stabilization of polymers. Solar energy collector 101 also comprises a receiver 115 which is an example of a receiving zone.

In one embodiment, Trough 110 comprises foam. Depending on the desired usage requirements there are at least two general classes of foam which can be chosen for the foam; rigid and flexible. Rigid foam can be for example Styrofoam. Styrofoam is a trademark name for polystyrene thermal insulation material, manufactured by Dow Chemical Company. Its advantage is that relatively thin structures can support both their own weight and that of the reflector 105. The disadvantage of using Styrofoam is that it can be somewhat brittle under large impact loading. Flexible foam can be for example polyethylene foam also known as packing foam. Polyethylene foam is readily available in a thickness of about 3.2 mm which is sufficient, when laminated with one or preferable two layers of PET film, to provide a stiff mechanical support to reflector 105.

In another embodiment, trough 110 comprises a vacuum-formed/blow-formed structure. Such a vacuum-formed/blow-formed structure resembles a large version of a modern soda or water bottle (or "blister" packaging) and can be fabricated by well known vacuum and or blowing techniques starting from sheet or tube thin-wall polymer (e.g. PET).

Trough 110, whether a foam or a vacuum-formed/blow-formed structure, can be further stiffened and strengthened by incorporating a thin layer of metal (e.g. aluminum) by lamination.

Solar energy collector 101 can optionally comprise a glaze tube 120. Optional glazed tube 120 will sometimes be desirable when collector 101 is used to collect sunlight in the converted energy form called heat.

FIG. 2a is an end view of another embodiment a solar energy collector utilizing the lightweight aperture of the invention. FIG. 2b is a top view of the solar energy collector of FIG. 2a. The length of the collector can be relatively short as illustrated or very much longer depending on particular application needs Solar energy collector 201 comprises a reflector 205 with a concentrating shape, which in this case is approximately the shape of a section of a cylindrical tube. The cylindrical shape is a specific example of an approximately constant cross-section shape. The cylindrical shape is a specific example of a surface with substantial curvature in only one dimension. Reflector 205 is held in place and in shape by window sheet 210 which is an example of a first support means for the reflector 205. By itself, reflector 205 would not be able to maintain its shape against the force of gravity since it is very thin and hence very flexible. The window sheet 210 is sealed against the long edges (lengthwise edges) of reflector to form a substantially leak-tight cylindrical structure 230 when pressurized within by a suitable gas (such as air).

To form a completely sealed vessel, the short ends (lateral edges) of the cylindrical structure 230 can be simply sealed (not illustrated), or sealed by attaching to seal end 240, a first bulkhead and seal end 250, a second bulkhead. The bulkheads can be constructed of thick and hence rigid materials (e.g. wood, plastic, metal etc.) or of thin flexible materials. Seal end 250 can also comprise an input port 260 to enable pressurization of the interior of the vessel 270. Seal end 240 can also comprise a fluid input 280 and seal end 250 can also comprise a fluid output 290 to provide cooling fluid to receiver 215 which is an example of a receiving zone.

A preferred example of reflector 205 and window sheet 210 is polymer (e.g. polyester terephthalate (PET)) film with a thickness under 250 μm. For added lifetime its is also preferred that reflector 205 and window sheet 210 also be protected by a thin topcoat of acrylic containing ultraviolet (UV) light blockers, stabilizers, or brighteners or the like as are well know in the art of sunlight stabilization of polymers. To provide light reflecting characteristics to reflector 205 a metallized (e.g. aluminum) layer should be included. Solar energy collector 201 also comprises a receiver 215 which is an example of a receiving zone.

Solar energy collector 201 can optionally comprise a glazed tube 220. Glazed tube 220 will sometimes be desirable when collector 201 is used to collect sunlight in the converted energy to form heat.

Figure 2C:
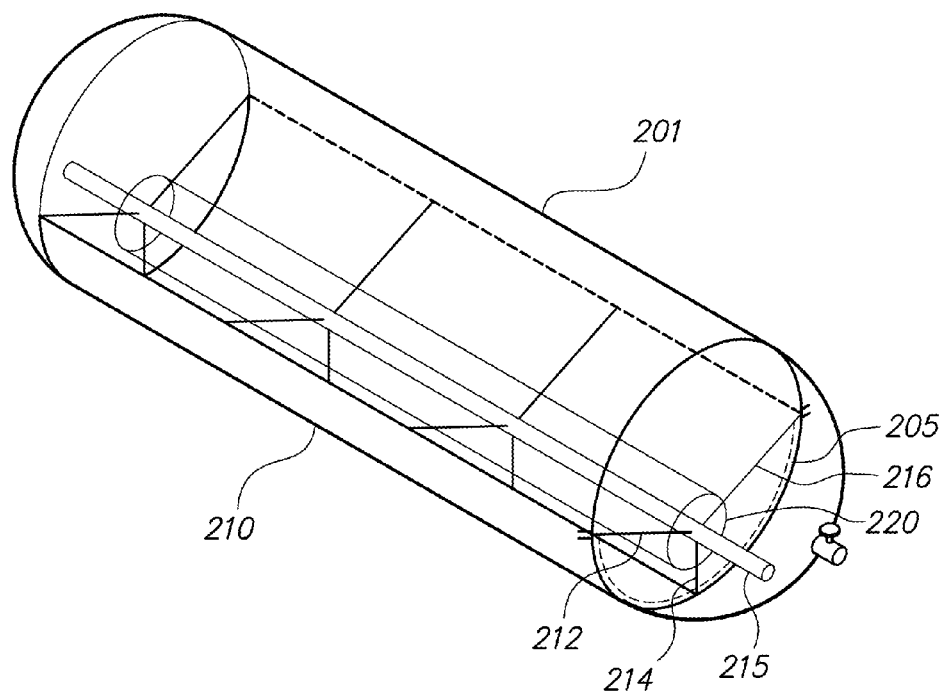
FIG. 2c is a perspective or isometric view of the solar energy collector of FIGS. 2a and 2b.

FIG. 2c shows a perspective or isometric view of the solar energy collector assembly 201, which in one embodiment comprises a sealed and inflated cylindrical-tube shaped housing 201. As shown in FIG. 2c, the solar collector assembly 201 comprises a sealed and inflated cylindrical-tube shaped housing. The tube housing includes a bottom cylindrically-trough shaped reflector portion having a reflection surface extending along a longitudinal length. The reflection surface preferably is made of a relatively thin and flexible metalized polymer film.

The assembly 201 further includes a top cylindrically-shaped transparent polymer film sheet portion made of a relatively thin and flexible polymer film. The top and bottom sheet portions form a pressure sealed cylindrical tube housing when the respective ends of the top and bottom films are sealed together and the tube housing is inflated with a gas via valve 230 so that the top transparent film portion passes solar energy to the reflection surface. The collector assembly shown in FIG. 2c further includes a receiver tube disposed longitudinally above the reflection surface in a focal line or focal plane of the cylindrical-trough shaped reflector portion. The absorber tube extends along the longitudinal length of the reflection surface, and contains a heat transfer fluid for absorbing solar energy reflected from the reflection surface to the focal line or focal plane.

One embodiment of making the reflector tube of the instant invention is to start from thin polymer material that is produced in tubular form, rather than flat sheet or film form. It is well known in the art of plastics processing that tubular films can be produced, for example, by blowing a bubble in molten polymer in a process known as blown film extrusion.

Figure 2D:
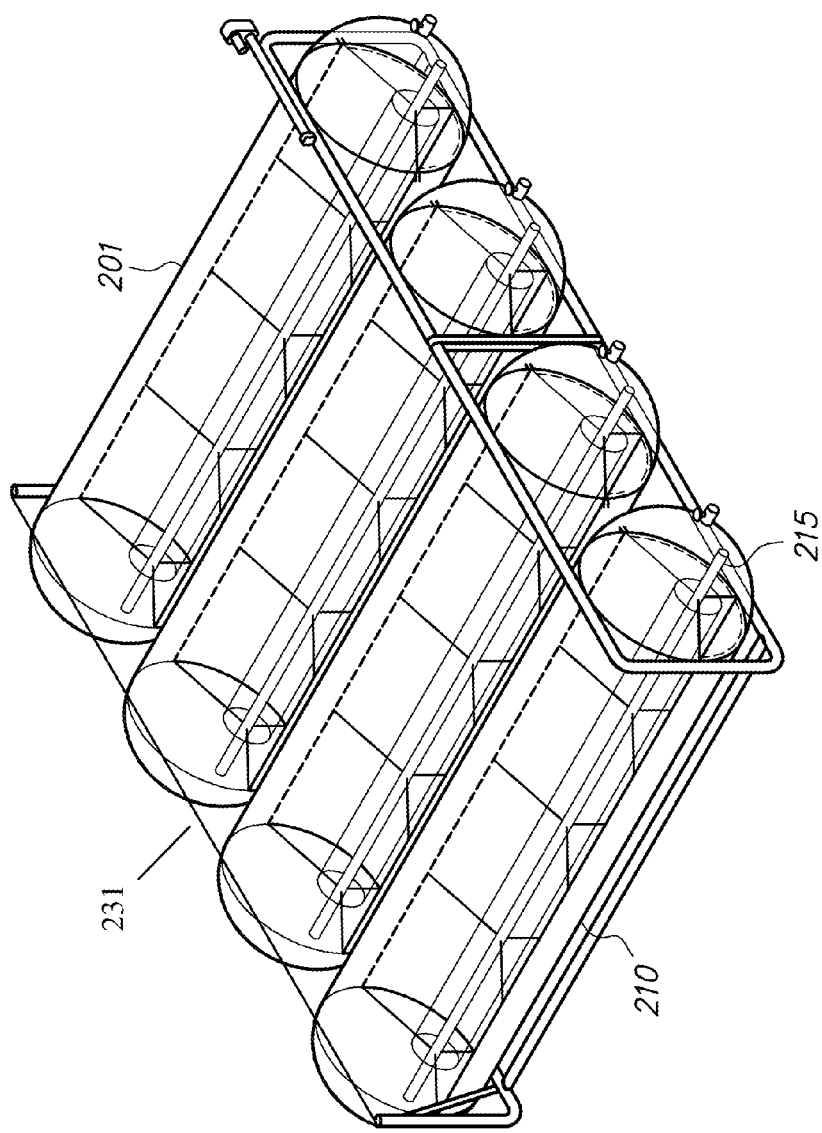
FIG. 2d is a perspective view of a solar energy collector array.

FIG. 2d is a perspective view of a solar energy collector array, in which four solar collector assemblies 201 are combined in an array configuration. The solar collector array shown in FIG. 2d is supported by support frame 240 and can be moved by a suitable drive/tracking system 250. Further details of the support frame are described in conjunction with FIG. 16, and further details of the drive/tracking system are described in conjunction with the FIG. 17. The array configuration shown in FIG. 2d is suitable for mounting on a support structure, such as the roof of a building, a ground surface open area, or the like. Optional restraint line 231 is shown attached at two points of support frame 240. The restraint line 231 can be used to ensure that collector assemblies 201 remain located atop support frame 240 even in the presence of strong winds. The restraint line 231 is preferably made of lightweight yet strong material (e.g. nylon rope or steel cable).

FIG. 3a is a cross-section view of a vacuum-formed support rib 301 which can be used to stiffen or strengthen (or both) the support means of the lightweight aperture of the invention (e.g. the solar collectors of FIG. 1 and FIG. 2). Such a vacuum-formed structure resembles a large version of a modern soda or water bottle (or "blister" packaging) and can be fabricated by well known vacuum and or blowing techniques starting from sheet or tube thin-wall polymer (e.g. PET).

FIG. 3b is a cross-section view of a high modulus support rib system 311 which can be used to stiffen or strengthen (or both) the support means of the lightweight aperture of the invention (e.g. the solar collectors of FIG. 1 and FIG. 2). High modulus support rib system 311 comprises a high modulus support rib 320. If viewed from end on (not illustrated), the high modulus support rib 320 would look like a semi-circle or a parabola. Also show in FIG. 3b is a vacuum-formed holder 325. The illustrated arrow shows that high modulus support rib 320 is installed by sliding into the folds of the vacuum-formed holder 325. The function performed by vacuum-formed holder 325 is to position the high modulus support rib 320 on the surface of the support means (e.g. on trough 110 of FIG. 1) and resist forces which might otherwise tend to twist high modulus support rib 320 relative to the support means (which would otherwise defeat the reinforcing provided by high modulus support rib 320).

FIG. 4 is a cross-section view of a vacuum-formed support structure. The undulating shape generates a large amount of stiffness from a lightweight single part construction.

Figure 5A:
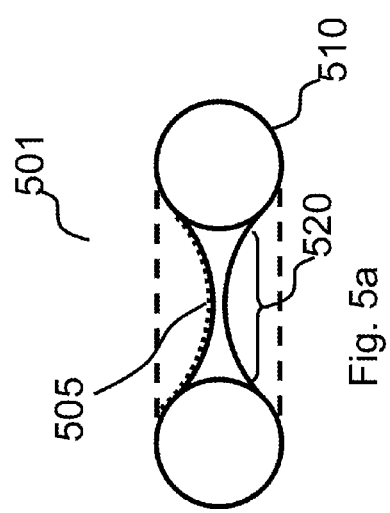
FIG. 5a is an end view of another embodiment a solar energy collector utilizing the lightweight aperture of the invention.
Figure 5B:
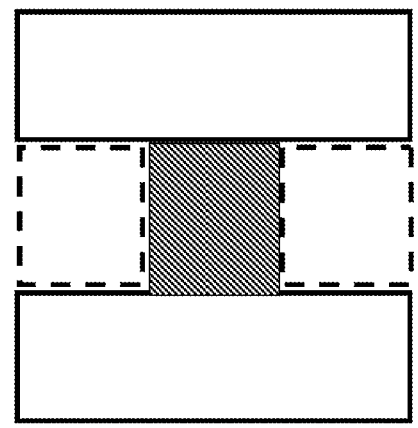

FIG. 5a is an end view of another embodiment a solar energy concentrator 501 utilizing the lightweight aperture of the invention. FIG. 5b is a top view a single section of the solar energy concentrator 501 of FIG. 5a. Solar energy concentrator 501 is an example where the first support means comprises a super-atmospheric structure 510 and a sub-atmospheric pressure structure 520. Solar energy concentrator 501 also comprises a reflector 505. The layers are polymeric sheet as described earlier for the solar collectors of FIG. 1 and FIG. 2.

Figure 6A:
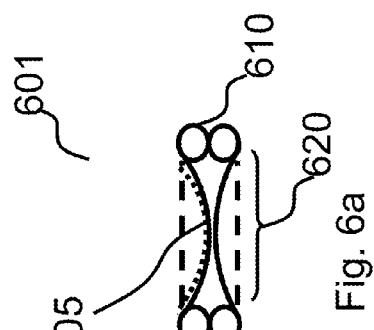
FIG. 6a is an end view of another embodiment a solar energy collector utilizing the lightweight aperture of the invention.
Figure 6B:
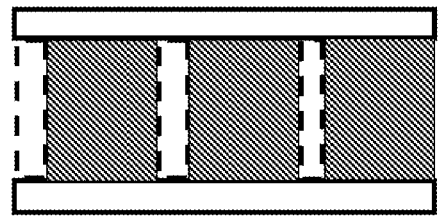

FIG. 6a is an end view of another embodiment a solar energy concentrator 601 utilizing the lightweight aperture of the invention. FIG. 6b is a top view a single section of the solar energy concentrator 601 of FIG. 6a. Solar energy concentrator 601 is an example where the first support means comprises a super-atmospheric structure 610 and a sub-atmospheric pressure structure 620. Solar energy concentrator 601 also comprises a reflector 605. The layers are polymeric sheets as described earlier for the solar collectors of FIG. 1 and FIG. 2. It can be seen that the double tube version of super-atmospheric structure 610 enable FIG. 6 to make more effective use of both film area and real estate regarding collector area. In other words, less film and real estate are needed per unit effective collector area in the design of FIG. 6 than in the design of FIG. 5.

Referring back to FIG. 1, an example of a second means of support (i.e. second support means) is shown schematically as self-supporting means 130. The self-supporting means 130 can be provided in a variety of manners. Examples of self-supporting means include a simple thick plate, a wheel with hub and spokes, an inflatable doughnut, a foam doughnut and a vacuum-formed doughnut. Additional examples of self-supporting means include foldable (or collapsible or inflatable) legs which attach to the receiver. The legs themselves are rigid enough to support both their own weight and in addition the weight of the receiver. The leg ends opposite to the attachment to the receiver can either attach to the first support means or simply touch the first support means.

Alternatively, a second example of a means of support can be provided by non-self-supporting means, in other words by tension members. FIG. 2 illustrates tension members 212, 214, and 216, which may optionally additionally comprise means for tension adjustment, such as turn-buckles. Examples of tension members include strings, wires, cords, threads, filaments, ropes, chains and so on. For applications where the receiving zone may experience highly elevated temperatures, fiber glass filaments or rope may be preferred. Fiber glass is reasonably strong, has low thermal conductivity and reasonably affordable. Tension members can also contain more than one material. In other words two different strings could be attached (e.g. tied) to each other to make a 2-part tension member. For example fiber glass can be used in a potentially high temperature region near the receiver zone, while a polymer twine (e.g. nylon or polypropylene) could be used in a lower temperature zone near the first means of support.

Figures 7A, 7B:
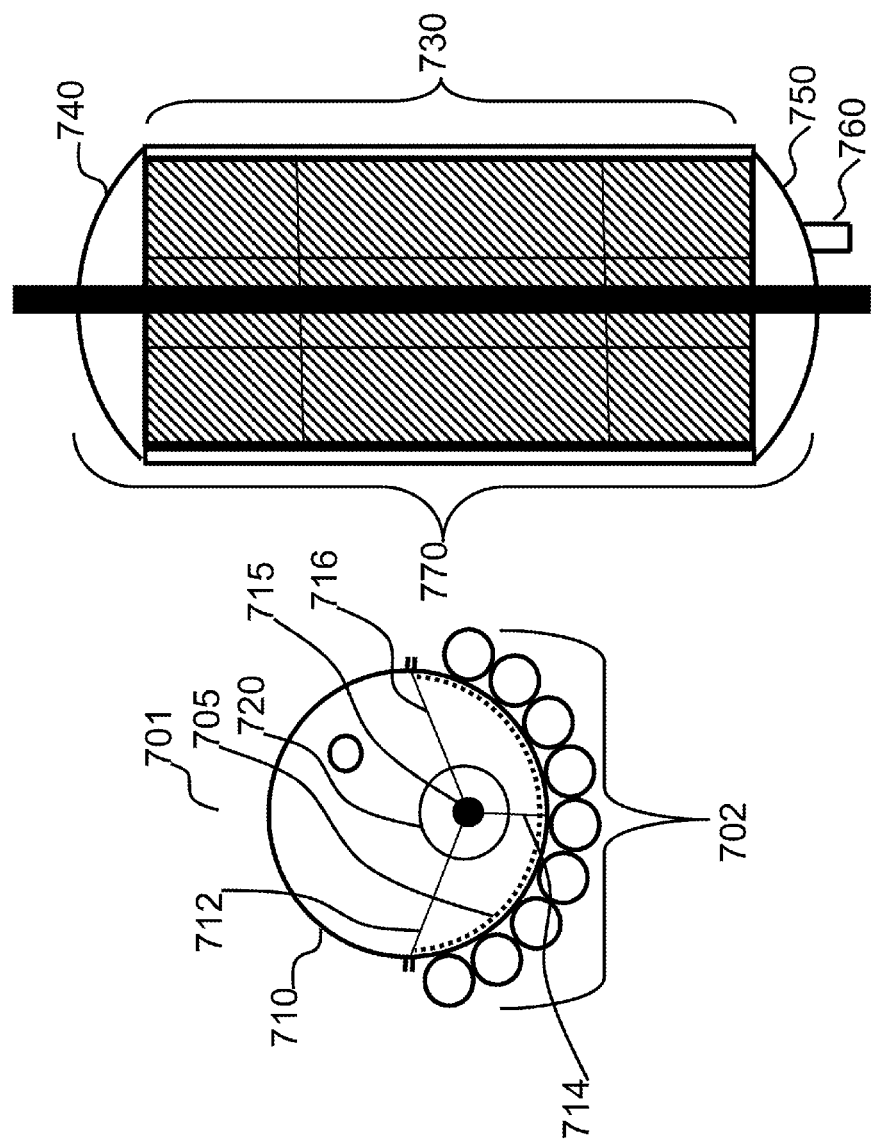

FIG. 7a is an end view of another embodiment a solar energy collector utilizing the lightweight aperture of the invention. FIG. 7b is a top view of the solar energy collector of FIG. 7a. The length of the collector can be relatively short as illustrated or very much longer depending on particular application needs.

Solar energy collector 701 comprises a plurality of water tubes 702. The water tubes 702 form an example of a localization means. A localization means keeps the collector 701 in a relatively constrained location in spite of environmental forces such a strong winds or heavy precipitation. A localization means can also tend to maintain the collector 701 in a specific orientation. For example for an east-west aligned collector 701, a localization means could be used to maintain a certain pointing angle relative to zenith for the collector 701 in spite of a strong wind. The water tube 702 can perform the localization function by having at least one tube filled at least partially with water. The weight of water tends to hold the collector 701 in place. By properly adjusting the filling of the water tubes with water and air, one can orient the pointing angle of the collector 701 relative to zenith.

The water tubes 702 can also form an example of a tracking means. A tracking means is capable of tracking the collector 701 to maintain an alignment with respect to the sun location whether on a seasonal basis or more preferably on a diurnal basis. With solar collector 701 aligned in a north-south orientation, it is possible to use the water tubes 702 to rotate the collector 701 throughout each day to track the sun. This tracking is accomplished by sequentially filling with water at least one, but preferably two or more tubes amongst the water tubes 702 with coordinated timing to match the movement of the sun across the sky.

The water tubes 702 can also participate in a stowage maneuver for the collector 701. Such stowage is highly desirable to survive a high wind situation (say above 50 kph). To accomplish such stowage one can substantially fill many of the tubes amongst the water tubes 702 with water while simultaneously partially deflating the collector 701. When this maneuver is performed, the collector 701 will assume a very much flattened appearing profile with corresponding low aerodynamic drag coefficient and foreshortened height. The combination of these two factors can reduce the drag per unit length of the collector 701 by about an order of magnitude and hence very substantially improve the collector's probability of surviving an extraordinarily high wind event.

The remainder of the description of the collector 701 is a repeat of the description of for collector 201 stated earlier. Solar energy collector 701 also comprises a reflector 705 with a concentrating shape, which in this case is approximately the shape of a section of a cylindrical tube. The cylindrical shape is a specific example of an approximately constant cross-section shape. The cylindrical shape is a specific example of a surface with substantial curvature in only one dimension. Reflector 705 is held in place and in shape by window sheet 710 which is an example of a first support means for the reflector 705. By itself, reflector 705 would not be able to maintain its shape against the force of gravity since it is very thin and hence very flexible. The window sheet 710 is sealed against the long edges of reflector to form a substantially leak-tight cylindrical structure 730 when pressurize within. To form a completely sealed vessel, the short ends of the cylindrical structure 730 can be simply sealed (not illustrated), or preferably sealed by attaching to seal ends 740 and 750. Seal end 750 also comprises an input port 760 to enable pressurization of the interior of the vessel 770.

A preferred example of reflector 705 and window sheet 710 is polymer (e.g. polyester terephthalate (PET)) film with a thickness under 750 μm. For added lifetime its is also preferred that reflector 705 and window sheet 710 also be protected by a thin topcoat of acrylic containing ultraviolet (UV)

light blocker, stabilizer, or brighteners or the like as is well know in the art of sunlight stabilization of polymers. To provide light reflecting characteristics to reflector 705 a metallized (e.g. aluminum) layer should be included. Solar energy collector 701 also comprises a receiver 715 which is an example of a receiving zone.

Solar energy collector 701 can optionally comprise a glaze tube 720. Optional glazed tube 720 will sometimes be desirable when collector 701 is used to collect sunlight in the form of heat.

Figure 8B:
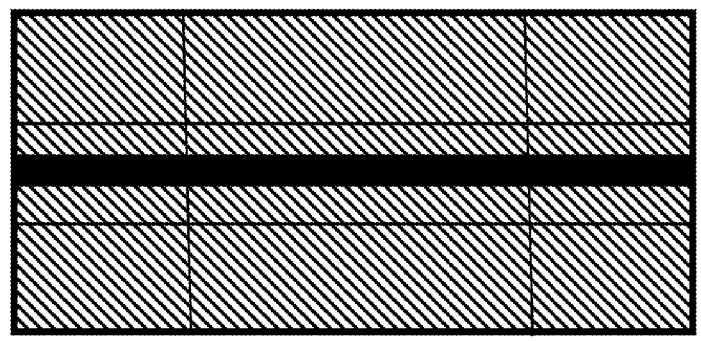
Figure 8A:
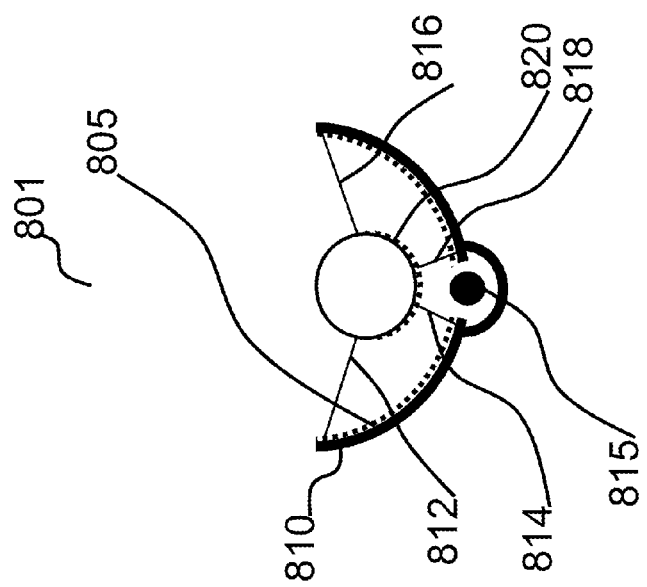
FIG. 8a is an end view of another embodiment a solar energy collector utilizing the lightweight aperture of the invention.

FIG. 8a is an end view of a solar energy collector 801 utilizing the lightweight aperture of the invention. FIG. 8b is a top view of the solar energy collector 801 of FIG. 8a, and can be either a complete collector or section of a longer collector. The collector 801 is similar to collector 101 described above, but additionally comprises a secondary reflector 820, an example of a receiving zone.

The collector 801 comprises trough 810, and tension members 812, 814, 816 and 818, which locate secondary reflector 820 relative to the trough 810. Due to the addition of the secondary reflector 820, a backplane zone 815 may be included and located, in this example, near the bottom of the trough 810. In this example, second means of support for the receive zone 815 can be any sort of attachment method to the trough 810 such a fasteners, tape, bolts etc. As for the method of locating the secondary reflector 820 it is clear that other methods can be employed including a simple thick plate, a wheel with hub and spokes, an inflatable doughnut, a foam doughnut a vacuum-formed doughnut and so on. Solar energy collector 801 can optionally comprise a glaze tube (not illustrated) which may be desirable for thermal collection, but will generally not be desirable to photovoltaic-only systems.

Figure 9:
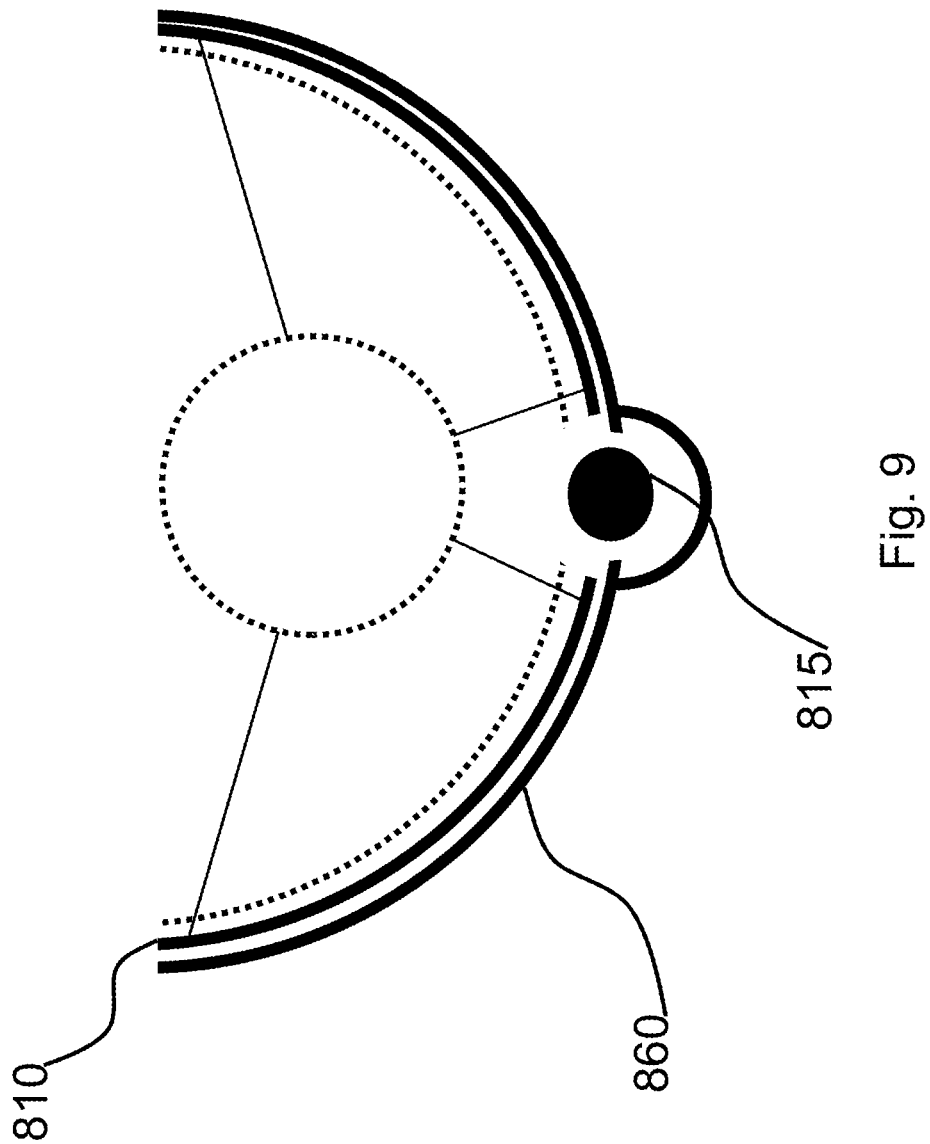
FIG. 9 is a blown-up end view of FIG. 8.

Backplane zone 815 may optionally comprised a photovoltaic module (not illustrated) and passive cooling system which is better seen by referring to FIG. 9.

FIG. 9 is a blown-up end view of FIG. 8. Collector 801 may optionally comprise a passive cooling system 860 shown in this example in the shape of a wall approximately following the shape of trough 810. The passive cooling system 860 can simply be a solid metal (e.g. aluminum) wall, or more preferably a partially hollowed wall, a specific example of which is illustrated in FIG. 10.

FIG. 10a is a side view of a passive cooling loop 1001 of the invention. To understand the orientation of this view relative to FIG. 9, imagine moving in the direction of "into the paper" of FIG. 9 and then looking directly to the left. Then one would see the side view FIG. 10a. FIG. 10b is a top view of the passive cooling loop 1001 of FIG. 10a. A cooling loop cell 1007 is shown in FIG. 10a and within the dashed box in FIG. 10b which represents a portion of the passive cooling system 860 referred to in FIG. 9. The cell shown in FIGS. 10a and 10b repeats along a substantial fraction of the passive cooling system 860 referred to in FIG. 9, such that multiple cooling loop convection cells can be utilized with the passive cooling system.

The cooling loop cell 1007 is substantially filled with a heat transfer fluid, for example water. Heat enters the cooling loop cell 1007 at the bottom of FIG. 10a and through an inner wall 1020 of FIG. 10b. Since heated fluid typically expands becoming lighter, it thereafter rises as indicated by the block arrows on the left side of FIG. 10a and by the circle-dot symbols of FIG. 10b. Upon reaching the top of the cell 1007, the fluid cools becoming denser and travels downward as indicated by the block arrows on the right side of FIG. 10a and by the circle-X symbol of FIG. 10b. It can be seen in FIG. 10b that blocks 1040, 1050 overlap portions of each other, such as at portion 1034 in FIG. 10b, and that the heat transfer is diagonal from the circle-dot symbol to the circle-X symbol in FIG. 10b.

The fluid also cools as it travels downward by transferring heat through outer wall 1030. Examination of fluidynamic flow equations shows that for flow channels that are of the order of 2 mm thick or thicker, significant water flow and hence significant heat transfer can be supported using this approach.

Wall blocks 1040 and 1050 can be made from, for example, foamed insulating polymers (e.g. Styrofoam, polyethylene, or polypropylene foam). The inner wall 1020 and the outer wall 1030 can be made from, for example, metal (e.g. aluminum) foil with a thickness as small as the order of 10 μm to 50 μm. Metal wall material will enhance the lateral transfer of heat as well as the through wall transfer. Optionally, the inner wall 1020 and the outer wall 1030 can each comprise a thin polymer layer (e.g. PET) to provide toughness to the walls. Alternatively, inner wall 1020 and the outer wall 1030 can each simply comprise polymer film (e.g. PET) with a thickness as small as the order of 50 μm.

FIG. 11a is a side view of a field-replaceable module 1101 of the invention. Receiving zones as described above (whether including a secondary reflector or not) can comprise a photovoltaic unit. Furthermore a photovoltaic unit can comprise a field-replaceable unit as exemplified by the field-replaceable module 1101. The field-replaceable module 1101 comprises solar cell layer 1110, a splitable heat transfer layer 1120, a highly thermally conductive (e.g. metal) layer 1130, and a heat removal layer 1140 (which may be either actively or passively cooled). An example of a splitable heat layer is a layer of viscous heat transfer liquid. A second example of a splitable heat layer is a split block of metal wherein the inner surfaces of the two sides of the split block have very closely matched contours which enable high heat transfer when the surfaces are put in contact. A third example of a splitable layer is a solid but pliant (via either elastic or inelastic deformation) layer.

FIG. 11b is a side view of a second embodiment of a field-replaceable module 1102. The field-replaceable module 1101 comprises solar cell layer 1150 bonded directly to a highly thermally conductive (e.g. metal) upper layer 1160, a splitable heat transfer layer 1170, a highly thermally conductive (e.g. metal) lower layer 1180, and a heat removal layer 1190 (which may be either actively or passively cooled).

FIG. 12a is a side view of a passive cooling plate 1201 of the invention. FIG. 12b is an end view of the passive cooling plate 1201 of FIG. 12a. The passive cooling plate 1201 comprises a plurality of fluid-filled fins 1210, a highly thermally conductive (e.g. metal) layer 1220, and a photovoltaic cell containing layer 1230. Each fluid-filled fin amongst the plurality of fluid-filled fins 1210 comprises a thin-layer shell (of thickness roughly 50 μm an to 250 μm) comprising either a polymer layer (e.g. PET) or a metal layer (e.g. aluminum foil) or both in a laminated combination. The thin-layer shell can optionally comprise additional polymer layers (e.g. polypropylene) which aid in the melt-sealing assembly of the fluid-filled fins 1210.

Still other optional layers may include, for example a protective acrylic topcoat of containing ultraviolet (UV) light blockers, stabilizers, or brighteners or the like as is well know in the art of sunlight stabilization of polymers. Yet an addition outer layer can comprise a selective emitter (i.e. a "white" appearing surface which substantially reflects sunlight, but is a good emitter of infrared heat radiation). The fluid which fills the fins 1210 should have high specific heat capacity, good thermal conductivity and reasonably low viscosity. A preferred fluid is water due too its good heat transfer properties, safe nature and extremely low cost.

Examination of fluidynamic flow equations shows that for fluid-filled fins 1210, with at least partially hollow cross-sections on the order of 2 mm thick or thicker, significant water flow and hence significant heat transfer can be supported by natural convection in a manner similar to that described earlier for a passive cooling loop. In this example as well as the prior example, it is not necessary to drive the flow around a particular circuit, but rather, the natural convection process can establish its own natural convective cells. This will occur simply by virtue of the fact that heat will be applied to the lower portion of passive cooling plate 1201 and heat will be removed by natural convection in the air between the fins 1210 (and similarly so in the prior example).

FIG. 13a is a side view of a heat exchanger 1301 of the invention. FIG. 13b is an end view of the heat exchanger 1301 of FIG. 13a. The passive cooling plate 1301 comprises a plurality of highly thermally conductive (e.g. metal) fins 1310, a highly thermally conductive (e.g. metal) layer 1320, and a photovoltaic cell containing layer 1330.

Examination of aerodynamic flow equations shows that for fins 1310 that contain air separations on the order of 2 mm thick or thicker, significant air flow and hence significant heat transfer can be supported by natural convection. This will occur simply by virtue of the fact that heat will be applied to the lower portion of passive cooling plate 1301 and heat will be removed by natural convection in the air between the fins 1310.

FIG. 14a is a schematic end view of a rotation mechanism 1401 of the invention. The rotation mechanism 1401 comprises an axis of rotation 1410 driven, for example by an electric motor (not illustrated) via a gear reduction box (also not illustrated). The point of FIG. 14a is to show that if large rotation angles need to be accommodated (as is typically required to track the sun throughout a day) then the axis of rotation 1410 must necessarily be a substantial distance above the mounting plane 1420 (which can be the surface of the earth or some suitable platform including a mobile platform). Examples of the need for such large angles include pointing to the east for collecting sunlight during early morning, pointing to the west for collecting sunlight during the late afternoon and completely inverting the collector 1430 to protect it during hail or high wind events. The rotation mechanism 1401 will be preferred for systems which include thermal collection (both thermal only systems and photovoltaic/thermal combination systems) since this approach makes for a simple way of running a fluid line through the collector.

FIG. 14b is a schematic end view of a translation mechanism 1402 of the invention. The translation mechanism 1402 comprises a drive mechanism 1450 shown schematically in FIG. 14b. The point of FIG. 14b is to show that if large rotation angles need to be accommodated, then the drive mechanism 1450 may be a relatively short distance above the mounting plane 1420. The utility of this approach is mounting hardware (not illustrated) for the drive mechanism 1450 can be much shorter than the mounting hardware for rotation mechanism 1401 of FIG. 14a. To better understand the translation mechanism 1402 the next figure expands on a detailed example.

FIG. 15 is an end view of an example of a translation mechanism 1501 for a lightweight aperture. The translation mechanism 1501 comprises a mount 1505, a motor-driven pulley 1510 (e.g. drive gear), a first corresponding pinch pulley 1515, an idler pulley 1520 and a second corresponding pinch pulley 1525. Taken together; the motor-driven pulley 1510 (e.g. drive gear), the first corresponding pinch pulley 1515, the idler pulley 1520 and the second corresponding pinch pulley 1525 correspond to an example of a means of rotation. Note that this means of rotation is also connected to a trough track 1527, which in this case is an example of at least a portion of a first support means. Also note that the mount 1505 is attached to a platform 1530. Examples of the platform 1530 can include a surface of the earth, a building, a structure, a vehicle, a water-going vessel, or even an airborne or space borne craft among others.

The mechanism as described so far works by translating the trough track 1527 when the motor-driven pulley 1510 is rotated. Since the trough track 1527 is curved, when it is moved through the translation mechanism 1501, the orientation of the trough track 1527 is thereby rotated. Thus tracking of a solar collector or more generally an aperture can be accomplished. The idler pulley 1520 and the second corresponding pinch pulley 1525 serve to "lock" in (i.e. stiffen against rotation by environmental forces, e.g. wind) the entire system.

By adding another level of sophistication, this mechanism can be made capable of inverting the solar collector. To do this the idler pulley 1520 and the second corresponding pinch pulley 1525 are now mounted so that they may be either fixed (relative to the location of the motor-driven pulley 1510 and the first corresponding pinch pulley 1515) or selectively translated. What is meant by selectively translated is that relative motion can be accommodated upon "selection". This relative motion is necessary to enable the trough track 1527 to be driven "around the relatively sharp corner" that can be seen in the upper left and upper right portions in FIG. 15. So when translating the trough track 1527 nears the sharp corners, this flexibility can be "selected." By contrast, when it is desired is to rotate the system (rather than invert it), this flexibility can be "un-selected."

Figure 16:
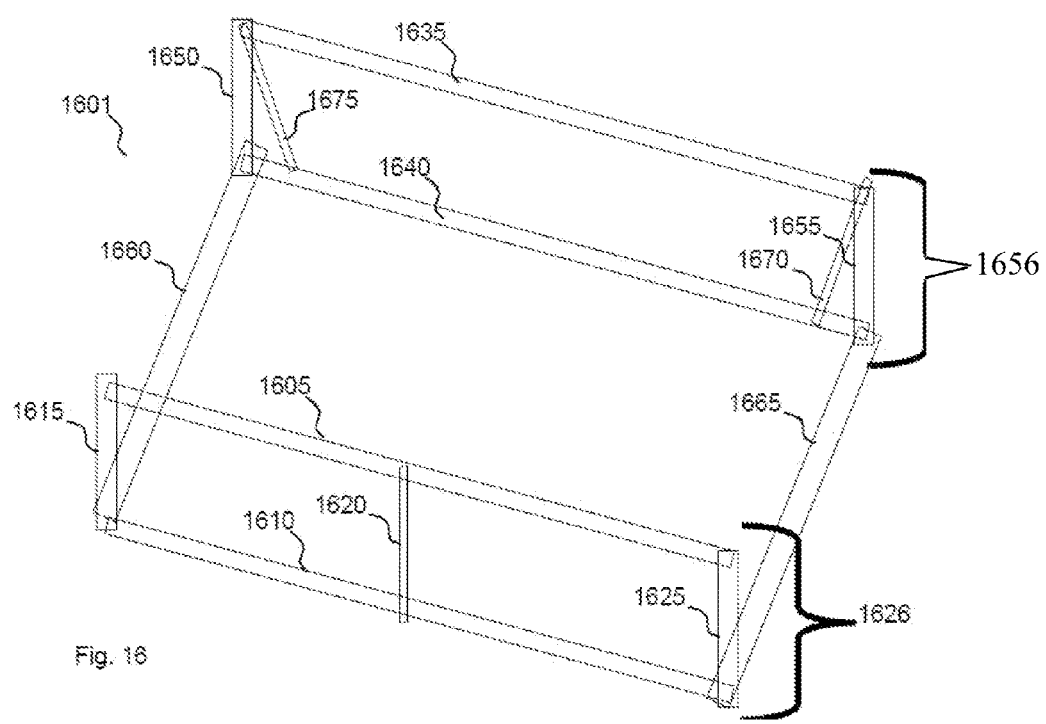
FIG. 16 shows a support frame which can be utilized with the embodiments shown in FIGS. 2a-2d.

FIG. 16 shows a support frame 1601 which can be utilized with the embodiments shown in FIGS. 2a-2d. Frame 1601, is preferable built up from rigid elongated members 1605, 1610, 1615, 1620, 1625, 1630, 1635, 1640, 1645, 1650, 1655, 1660, and 1665. Rigid elongated members 1605, 1610, 1615, 1620, 1625 form a first end frame 1626 which supports a solar tracking drive system illustrated and later detailed in FIG. 17. Furthermore, first end frame 1626 provides mechanical support against gravity, wind and other environmental loads for optical reflecting units on a first end. Similarly, rigid elongated members 1635, 1640, 1645, 1650, and 1655 form a second end frame 1656, which supports the optical reflecting units on their opposite end. Rigid elongated members 1660, and 1665 serve to maintain proper spacing between (and vertical support for) first end frame 1626 and second end frame 1656. Additional structural integrity and rigidity can be provided by rigid elongated members 1670 and 1675. Elongated members can take many forms though tubular (e.g. cylindrical) will be suitable in many cases. Another form for elongated member that will generally suitable is extruded angle (e.g. "angle iron").

Elongated members have been successfully built and tested which in one example are made of plastic (e.g. ABS plastic, or more specifically water drainage pipe nominal 2" diameter). In such a construction example, joints between elongated members are provided by water drainage pipe joints and assemblies are fastened together with cement as is common in the plumbing art. Elongated members have also been successfully built and tested which are made of metal (e.g. steel, or more specifically EMT electrical conduit nominal ½" diameter).

Figure 17:
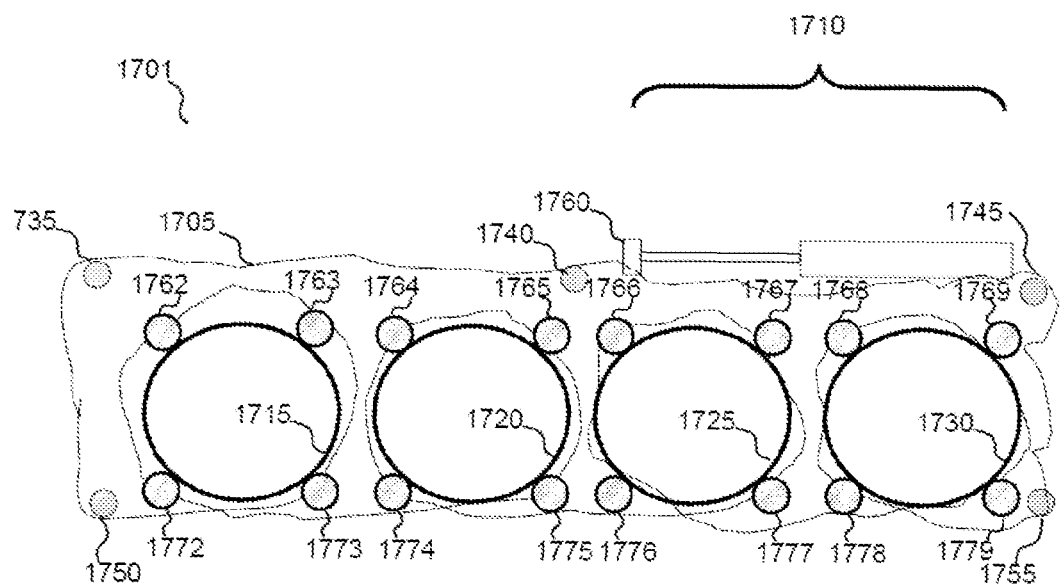
FIG. 17 shows a tracking/drive system which can be utilized with the embodiments shown in FIGS. 2a-2d.

FIG. 17 shows a tracking/drive system 1701 which can be utilized with the embodiments shown in FIGS. 2a-2d. Tracking/drive system 1701 uses cable loop 1705 to couple the driving force of linear actuator 1710 to rotate one or more rims exemplified by rims 1715, 1720, 1725 and 1730. Cable loop 1705 can couple to rims in wide variety of circuit configurations, but FIG. 17 shows a preferred circuit. It can be seen that the cable wraps around each of the rims 1715, 1720, 1725 and 1730 in turn. This full loop of wrapping around each rim (as opposed to simply wrapping around a small fraction of the circumference of each rim) ensures a tight and self-cinching grip which results in a high level of friction and thereby minimizes, if not completely eliminates, slip between the driving cable and the rotating rims.

To properly manage the motion of the cable, the cable loop 1705 is wrapped around of a set of pulleys 1735, 1740, 1745, 1750, and 1755 which are affixed to a frame (not shown in this figure). The rims 1715, 1720, 1725 and 1730 are preferably located at the ends of collector tubes (not shown in this figure) and more preferable a north end (assuming that the collectors tubes are oriented along a north-south axis and the system is in the northern hemisphere on the Earth), though they may also be located midway along such collector tubes (or any other location along the collector tubes for that matter).

There are two main reasons for preferring an end location for the rims 1715, 1720, 1725 and 1730. The first reason is that an end location gives easy access for maintenance of all of the parts of the tracking/drive system. The second reason is that locating the rims at the north end minimizes shadows cast by the rims (assuming that the collector's tubes are oriented along a north-south axis and the system is in the northern hemisphere on the Earth). In some situations, a central location for the rims along the collector tubes may be preferred. This preference would correspond to systems which have very long collector tubes and would be chosen to optimize the transfer of torque along the very long collector tubes.

Cable loop 1705 is attached to a movement arm 1760 of linear actuator 1710, for example by a nut and bolt (not illustrated). Linear actuator 1710 is also affixed to a frame (not shown in this figure) and can be any linear actuator as is commonly available in the solar tracking industry. Linear actuator 1710 is preferably affixed to an upper portion or top of a frame to ease maintenance and to avoid being submerged when heavy rains might flood where the tracking/drive system 1701 is located. A turnbuckle (not shown) could be utilized to provide tightening of the cable loop 1705 by suitable adjustment.

To assure that the forces applied to the rims result in essentially pure rotation (i.e. with no significant translation), the rims 1715, 1720, 1725 and 1730 are supported and translationally constrained by casters 1762, 1763, 1764, 1765, 1766, 1767, 1768, 1769, 1772, 1773, 1774, 1775, 1776, 1777, 1778 and 1779. The rims are preferably shaped like typical bicycle rims and can actually be bicycle rims. The casters preferably have wheels that are narrow enough to fit within the circumferential trough of the rims (i.e. the circumferential region around bicycle rims where bicycle tires are normally gripped by the rims).

Figure 18:
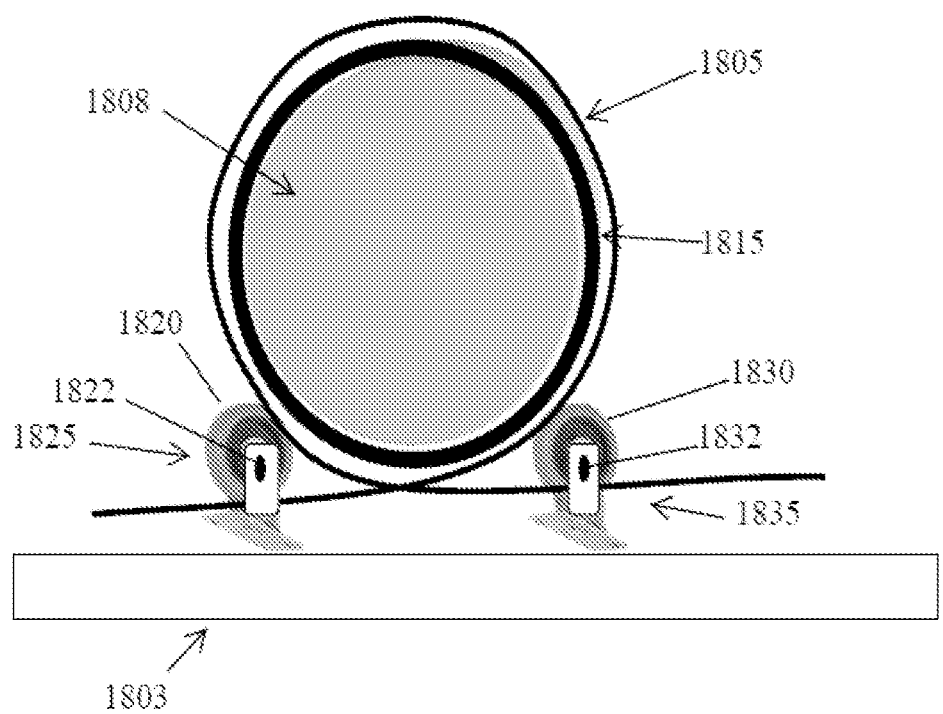
FIG. 18 shows an end, cross-sectional view of a portion of a drive/tracking system which can be utilized with the embodiments shown in FIGS. 2a-2d, 16 and 17.

FIG. 18 shows details of a tracking/drive system and more particularly, FIG. 18 shows an end, cross-sectional view of a portion of a drive/tracking system which can be utilized with the embodiments shown in FIGS. 2a-2d, 16 and 17.

In FIG. 18, a rim 1815 is supported on rollers 1820 and 1830. The rim 1815 is in contact with the sealed and inflated cylindrical tube housing 1808. The rollers 1820 and 1830 are parts of a first set of casters 1825 and 1835 respectively and supported by axels 1822 and 1832 respectively. Note that cable loop 1805 wraps around the rim 1815 and under both axels 1822 and 1832. This preferred routing of the cable loop 1805 ensures that rim 1815 will remain located (held down) during a high wind gust. The first set of casters 1825, 1835 are affixed to the top portion of elongated support member 1803. A second set of casters (not shown in FIG. 18) could be affixed at the top of rim 1815 with another elongated support member (not shown) to provide still further support. It should be understood that the cable loop 1805 is completely wrapped around the rim 1815 to provide a gripping action, which enables controlled rotation of the rim 1815 (and the cylindrical housing 1808), thereby minimizing or eliminating translational movement.

Other embodiments of the present invention for solar collectors could be for when a single collector housing is utilized, or for when two tracking systems are desired for both ends of, for example, a solar collector array where the sealed and inflated cylindrical tube housings each have an extended horizontal length. Other embodiments of the present invention for tracking can apply to solar collectors of a broad range of configurations and are not restricted to those comprising sealed and inflated cylindrical tube housings.

While the invention has been described in terms of a collector of solar energy for both thermal and photovoltaic (and combination) energy systems, it is important to explicitly state that this lightweight aperture can be used for other systems as well. One such system is radio frequency technology where the aperture can be used for transmission, or reception or both. The radio frequency band of primary interest extends from a few tens of MHz up to several hundred GHZ. This range can even extend through the THz bands for either short range (e.g. radar) applications within the earth's atmosphere or to long range application in outer space.

The aperture of the invention need not be restricted to electromagnetic radiation. With suitable wall materials (to assure good reflectivity) the aperture can be used for acoustic applications. Examples would include sensitive listening systems in the air and a multitude of underwater sound-based devices.

Once given the above disclosure, therefore, various other modifications, features or improvements will become apparent to the skilled artisan. Such other features, modifications, and improvements are thus considered a part of this invention, the scope of which is to be determined by the following claims.

What is claimed is:

1. In a solar collector assembly comprising a sealed and inflated cylindrical-tube shaped housing, the tube housing including a bottom cylindrically-trough shaped reflector portion having a reflection surface extending along a longitudinal length, the reflection surface made of a relatively thin and flexible metalized polymer film, a top cylindrically-shaped transparent polymer film sheet portion made of a relatively thin and flexible polymer film, the top and bottom sheet portions forming a pressure sealed cylindrical tube housing when the respective ends of the top and bottom films are sealed together and the tube housing is inflated with a gas so that the top transparent film portion passes solar energy to the reflection surface, a passive cooling component comprising: a partially hollowed wall structure extending below and longitudinally along the bottom cylindrical shaped housing wherein the hollowed wall structure includes multiple cooling loop convection cells formed within the hallowed wall structure.

2. The assembly of claim 1 wherein each cooling loop cell is substantially filled with a heat transfer fluid.

3. The assembly of claim 2 wherein the heat transfer fluid is water.

4. The assembly of claim 3 wherein the multiple cooling loops form flow channels which are at least 2 mm thick.

5. The assembly of claim 4 wherein the hallowed wall structure is in the form of overlapping wall blocks.

6. The assembly of claim 5 wherein the wall blocks are formed from foamed insulating polymers.

7. The assembly of claim 5 wherein the hallowed wall structure includes inner walls and outer walls formed from a metal with thickness between 10 um and 50 um.

8. The assembly of claim 7 wherein the inner and outer walls are formed from a thin polymer layer.

9. The assembly of claim 7 wherein the inner and outer walls are formed from a polymer film.

10. A solar collector assembly comprising:
- a sealed and inflated cylindrical-tube shaped housing, the tube housing including a bottom cylindrically-trough shaped reflector portion having a reflection surface extending along a longitudinal length, the reflection surface made of a relatively thin and flexible metalized polymer film;
- a top cylindrically-shaped transparent polymer film sheet portion made of a relatively thin and flexible polymer film, the top and bottom sheet portions forming a pressure sealed cylindrical tube housing when the respective ends of the top and bottom films are sealed together and the tube housing is inflated with a gas so that the top transparent film portion passes solar energy to the reflection surface;
- a receiver tube disposed longitudinally above the reflection surface in a focal line or focal plane of the cylindrical-trough shaped reflector portion, the absorber tube extending along the longitudinal length of the reflection surface, the absorber tube containing a first heat transfer fluid for absorbing solar energy reflected from the reflection surface to the focal line or focal plane; and
- a passive cooling component including a partially hollowed wall structure extending below and longitudinally along the bottom cylindrical shaped housing wherein the hollowed wall structure includes multiple cooling loop convection cells formed within the hallowed wall structure.

11. The assembly of claim 10 wherein each cooling loop cell is substantially filled with a heat transfer fluid.

12. The assembly of claim 11 wherein the heat transfer fluid is water.

13. The assembly of claim 12 wherein the multiple cooling loops form flow channels which are at least 2 mm thick.

14. The assembly of claim 13 wherein the hallowed wall structure is in the form of overlapping wall blocks.

15. The assembly of claim 14 wherein the wall blocks are formed from foamed insulating polymers.

16. The assembly of claim 14 wherein the hallowed wall structure includes inner walls and outer walls formed from a metal with thickness between 10 um and 50 um.

17. The assembly of claim 14 wherein the inner and outer walls are formed from a thin polymer layer.

18. The assembly of claim 14 wherein the inner and outer walls are formed from a polymer film.

19. An array of solar collector assemblies, each solar collector assembly of the array comprising:
- a sealed and inflated cylindrical-tube shaped housing, the tube housing including a bottom cylindrically-trough shaped reflector portion having a reflection surface extending along a longitudinal length, the reflection surface made of a relatively thin and flexible metalized polymer film;
- a top cylindrically-shaped transparent polymer film sheet portion made of a relatively thin and flexible polymer film, the top and bottom sheet portions forming a pressure sealed cylindrical tube housing when the respective ends of the top and bottom films are sealed together and the tube housing is inflated with a gas so that the top transparent film portion passes solar energy to the reflection surface;
- a receiver tube disposed longitudinally above the reflection surface in a focal line or focal plane of the cylindrical-trough shaped reflector portion, the absorber tube extending along the longitudinal length of the reflection surface, the absorber tube containing a heat transfer fluid for absorbing solar energy reflected from the reflection surface to the focal line or focal plane; and
- a partially hollowed wall structure extending below and longitudinally along the bottom cylindrical shaped housing wherein the hollowed wall structure includes multiple cooling loop convection cells formed within the hallowed wall structure.

* * * * *